United States Patent [19]

Owens et al.

[11] Patent Number: 4,590,665

[45] Date of Patent: May 27, 1986

[54] METHOD FOR DOUBLE DOPING SOURCES AND DRAINS IN AN EPROM

[75] Inventors: Alexander H. Owens, Pennington, N.J.; Mark A. Halfacre, Horsham, Pa.; Wing K. Huie, North Wales, Pa.; David S. Pan, Doylestown, Pa.

[73] Assignee: Solid State Scientific, Inc., Willow Grove, Pa.

[21] Appl. No.: 680,199

[22] Filed: Dec. 10, 1984

[51] Int. Cl.⁴ .................. H01L 29/78; G11C 11/40
[52] U.S. Cl. .................................. 29/571; 29/576 B;
29/577 C; 148/1.5; 148/187; 148/DIG. 82;
357/23.5; 357/42; 357/91
[58] Field of Search ............... 29/571, 576 B, 577 C;
148/1.5, 187; 357/42, 23, 91

[56] References Cited

U.S. PATENT DOCUMENTS

| | | | |
|---|---|---|---|
| 4,119,995 | 10/1978 | Simko | 357/23 |
| 4,369,072 | 1/1983 | Bakeman et al. | 148/1.5 |
| 4,373,249 | 2/1983 | Kosa et al. | 29/571 |
| 4,472,871 | 9/1984 | Green et al. | 29/571 |
| 4,488,351 | 12/1984 | Momose | 29/576 B |
| 4,495,693 | 1/1985 | Iwahashi et al. | 29/576 B |
| 4,514,897 | 5/1985 | Chiu et al. | 29/578 |
| 4,517,732 | 5/1985 | Oshikawa | 29/571 |

OTHER PUBLICATIONS

Ohta et al., IEEE Trans. Electron Devices ED-27, (1980), 1352.
S. Fukunaga et al., FA-CMOS Process for Low Power PROM with Low Avalanche Injection Voltage, International Electron Devices Meeting (IEEE Conference), 1977.

Primary Examiner—Upendra Roy

[57] ABSTRACT

A CMOS EPROM or the like is made wherein the basic memory device or EPROM device is an N-channel IGFET (insulated gate field effect transistor) having a control gate self-aligned with an underlying floating gate. The sources and drains of the EPROM devices as well as the sources and drains of peripheral N-channel transistors, are made by implanting with arsenic and with phosphorous. When heated, the faster diffusing phosphorous outruns, and extends from the bulk of, the arsenic so that these sources and drains extend slightly under the adjacent gate. This extension of the drain in the memory device enables a faster programming capability. A similar but oppositely directed lateral extension of all these sources and drains reduces the leakage to the substrate and reduces the chances of shorts to the substrate due to slightly misaligned metal to source and drain contacts.

3 Claims, 2 Drawing Figures

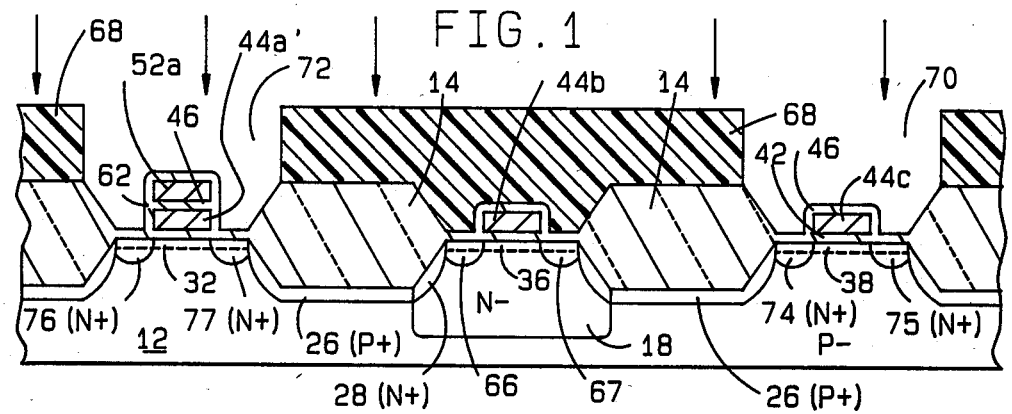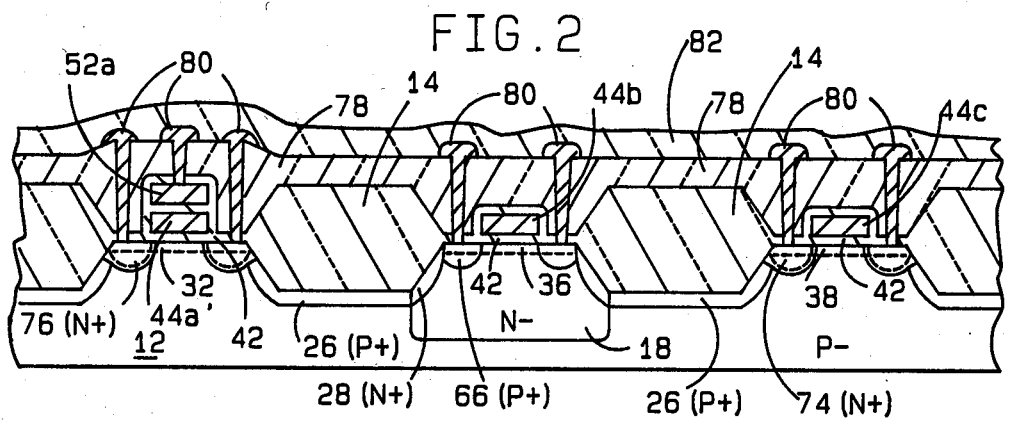

METHOD FOR DOUBLE DOPING SOURCES AND DRAINS IN AN EPROM

BACKGROUND OF THE INVENTION

This invention relates to an integrated circuit employing floating gate memory devices of the FAMOS type (floating gate avalanche injection MOS) and more particularly to an integrated-circuit electrically-programmable-read-only-memory (EPROM) having an array of N-channel IGFET memory devices employing a floating gate and IGFET N-channel peripheral devices that control and sense the memory devices, and even more particularly relates to such floating gate devices having double diffused sources and drains.

An EPROM that employs floating-gate IGFET devices is described in the application filed concurrently herewith, entitled Method for Making a Self-Aligned CMOS EPROM Wherein the EPROM Floating Gate and CMOS Gates Are Made From One Polysilicon Layer.

In addition to having a control gate similar to the control gate of the peripheral devices, FAMOS and more particularly EPROM devices have a floating gate positioned below the control gate. It is this floating gate which allows the EPROM device to store charge, thereby programming the EPROM device. Conversely, when the EPROM device is unprogrammed, the floating gate is uncharged.

The architecture required places constraints on the size of the EPROM device. Since the floating gate must rest directly below the control gate, both gates must be large enough to allow their proper alignment. Self-alignment of both the control gate and the floating gate allows a reduction in the size of the EPROM device.

Most conventional commercial EPROM integrated circuits are NMOS wherein both the EPROM device and all the peripheral devices are N-channel. CMOS EPROMs have been disclosed wherein in addition to N-channel EPROM devices the peripheral transistors are both N-channel and P-channel. This invention pertains to the double doping of drains and sources of N-channel memory devices as well as N-channel peripheral devices.

A laboratory CMOS EPROM has been disclosed that includes EPROM devices each having a double diffused drain to enhance the programming efficiency thereof. However, it was specifically taught in that disclosure that the second doping was P-type while the first doping was N-type, and neither the EPROM device source, or the sources and drains of peripheral devices without floating gates were double diffused.

It is an object of the present invention to provide an integrated circuit IGFET EPROM device or the like having a double diffused source and drain.

It is a further object of this invention to provide such an integrated circuit wherein the EPROM device and peripheral control devices are N-channel IGFET devices all having double diffused sources and drains.

It is yet a further object of this invention to provide a method for making such an EPROM device wherein the addition of the second of the double doping of sources and drains does not require the addition of another masking step.

SUMMARY OF THE INVENTION

A method for making an EPROM integrated circuit includes forming an insulating layer over a silicon substrate. The region of the substrate at which an EPROM device is to be formed has a conductivity of one type. At a central portion of a region of the substrate at which the EPROM device is to be formed, a first EPROM gate is formed. Then ions of a first kind are implanted through the insulating layer into the substrate at two subregions within the EPROM region that are on opposite sides of and adjacent to the first gate to form the source and drain of the EPROM device. Ions of a second kind are implanted into the two subregions wherein the first and second kind ions are of the opposite conductivity type, and the second kind ions have a greater coefficient of diffusion in silicon than ions of the first kind.

The term EPROM as used herein means a memory circuit that can be programmed electrically, including programmable logic arrays, which memory circuits employ FAMOS devices as the basic memory (EPROM) device.

It is significant that the floating gate, and source and drain, are mutually self-aligned with the source and drain extending equally under the gate in overlapping relationship by about 0.1 micron, and that amount of overlap would be difficult to increase very much by the technique of lateral diffusion of a fast diffusing dopant as is used in this invention. This tiny amount of overlap surprisingly produces a substantial improvement in the programming efficiency of the EPROM device.

BRIEF DESCRIPTION OF THE DRAWING

FIG. 1 shows in side sectional view a partially fabricated CMOS EPROM device of this invention at a stage at which dopants are selectively introduced into the substrate to form the source and drain.

FIG. 2 shows in side sectional view the CMOS EPROM of FIG. 1 after completion of all diffusions, metallization and passivation.

DESCRIPTION OF THE PREFERRED EMBODIMENT

In the process of this invention, certain early steps are executed that provide a structure illustrated in FIG. 1. These early steps are described and illustrated in more detail in the copending application Ser. No. 680,198 filed simultaneously herewith entitled Method For Making A Self-Aligned CMOS EPROM Wherein The EPROM Floating Gate And CMOS Gates Are Made From One Polysilicon Layer. That application is incorporated by reference herein. A brief description of those early steps follows.

A P-type substrate 12 upon which a self-aligned EPROM and both P-channel and N-channel peripheral transistors are to be formed is covered with a silicon dioxide layer that is formed by exposing substrate 12 to a high temperature in the presence of oxygen. After this initial oxidation, a conventional photoresist etch is performed. In this etching step, a layer of photoresist is used to selectively etch the oxide layer creating an aperture in the oxide layer.

This is followed by an N-well ion implant wherein N-type ions such as phosphorous ions bombard the entire substrate surface. However, only the region of substrate 12 beneath the oxide aperture receives these N-type ions causing a predetermined concentration of impurities in region 18.

Following the N-type implant, photoresist layer is stripped, and an N-well diffusion is performed. In this step, the substrate is raised to a high temperature, approximately 1200°. This high temperature causes the N-type dopant to migrate forming an N-well 18 in FIG. 1. Before the diffusion, well 18 has a depth of approximately a few thousand angstroms. After the diffusion, it has a depth of approximately 30,000 angstroms. This creates the N-well in which the P-channel transistor is built.

During the high temperature diffusion process, silicon dioxide layer 14 grows several hundred angstroms because of further oxidation. Silicon nitride is then deposited on the surface of oxide layer 14 forming a nitride layer that is then etched through a photoresist masking layer to mask all the regions where a device is to be built, whether the device is an EPROM device, a P-channel transistor, or an N-channel transistor. This etching removes the regions of the silicon nitride layer not covered by the mask.

Following the nitride etch, P+ guard rings 26 are formed by a blanket boron implant.

After the formation of guard rings 26 the photoresist masking layer is removed and a new photoresist masking layer is provided which is used with the remaining patches of the nitride layer as masks to a phosphosous ion implant to create N+ guard ring 28 with N-well 18.

That photoresist layer is then removed and a field oxidation is performed during which the substrate is subjected to a high temperature for a long period of time causing oxide layer 14 to become greatly enlarged as shown in FIG. 1. The remaining patches of nitride layer 22 are then removed.

The removal of the nitride layer is followed by a blanket channel implant with a P-conductivity type impurity such as boron. In this implant, the threshold of all three devices are adjusted. The regions under the enlarged oxide layer 14 are, of course, not affected by this implant. The enlarged regions of oxide layer 14 are too thick for the implant to penetrate and serve as a mask.

Silicon dioxide region 40 covers the substrate 12 at this point. The ultimate thickness of the oxide at the channel regions will also determine the threshold of the EPROM and the N-channel and P-channel devices. However, the thickness of region 40 was not precisely controlled, and is removed.

A high quality insulating oxide layer 42 is grown in the same location from which oxide layer 40 was removed.

The oxidation to form layer 42 is followed by deposition of a layer of polysilicon. This first polysilicon layer is formed of conventional polycrystalline silicon which is deposited in a conventional vapor depositing step. It may be doped with N+ type ions to make it more conductive. This may be accomplished by a standard phosphorous diffusion step, known as $POCl_3$ doping to impart conductivity to the polysilicon layer 44 amounting to about 15 ohms per square.

In a photoresist masking step and subsequent etching step, the first polysilicon layer is removed except at the area of the entire EPROM device, and the areas just over a central part of each of the P-channel and N-channel devices to define the gates 44b and 44c, respectively, of the P-channel and N-channel devices. Those remaining polysilicon regions are then oxidized to form the silicon oxide layer 46.

A second blanket layer of polycrystalline silicon is deposited upon the substrate and is doped with N-type dopant, thereby creating a highly conductive N+ second polycrystalline layer.

Now the critical EPROM gate etches are performed. It is these etches which produce the self-aligned gate structure which allows a reduction in size of the EPROM matrix of the CMOS circuit. During these EPROM gate etches, a photoresist layer covers the peripheral devices gate regions, namely both P-channel transistor region 36 and N-channel transistor region 38, and separately covers a central portion of N+ polysilicon layer above EPROM channel region 32.

The first etch is an N+ polysilicon etch which removes the second N+ polysilicon layer except for the central portion of the photoresist layer. The second etch is a buffered-hydrofluoric polycrystalline-oxide etch which removes polycrystalline oxide layer 46 except for the central portion of the photoresist layer. The final etch is a polysilicon etch which removes the first polysilicon layer except for the portion below the central portion of the photoresist layer. The resulting self-alignment of the two EPROM gate structures 44a' and 52a allows reduction in EPROM size.

Following the series of etches to form the EPROM gate structures, a new photoresist layer is formed to cover the EPROM region 32, leaving open the polysilicon layer 44b above P-channel region 36 and the polysilicon layer 44c above the N-channel region 38.

The second polysilicon layer portion overlying the N- and P-channel regions is then removed and a second polysilicon oxidation step is performed which results in the formation of the polysilicon oxide layer 62 on the EPROM gate structure shown in FIG. 1 and also adds thickness to the oxide layer 46 that covers P-channel gate 44b and N-channel gate 44c.

To form source 66 and drain 67 of the P-channel transistor, a p-type ion implant is performed with another masking layer preventing ions from being implanted in the N-channel transistor region 38 and in the EPROM device channel region 32, while P-channel gate 44b, along with its oxide layer 46, prevent p-type ions from entering channel region 36 underneath them. The enlarged regions of oxide layer 14 prevent the p-type ions from being implanted in N+ guard rings 28.

The source and drain regions of the EPROM and the N-channel transistor are now formed. A new photoresist layer 68 is formed. Photoresist layer 68 has aperture 70 above the region where the N-channel transistor is to be formed and aperture 72 above the region where the EPROM device is to be formed. Following the formation of apertures 70 and 72 in layer 68, N-type arsenic ions are implanted. N-channel transistor gate 44c and its oxide layer 46 protect a portion of N-channel region 38 from receiving the ion implants. This results in the formation of N+ source and drain regions 74 and 75 which provides gate-aligned channels 32 and 38.

In a similar manner, control gate 52a and floating gate 44a protect a portion of the N-channel EPROM region 32 thereby causing the ion implant to form N+ source and drain regions 76 and 77. Thus, the source and drain regions 76 and 77 of the N-channel EPROM device and 74 and 75 of the N-channel transistor are formed simultaneously, and are called self-aligned N+ sources and drains.

After or before arsenic is implanted, the sources 74 and 76 and drains 75 and 77 of the N-channel transistor device and EPROM device are subjected to a second implant, this time of phosphorous ions which is also an N-type dopant, through the same apertures 70 and 72 of the photoresist mask 68.

Since phosphorous has a greater diffusion rate than arsenic, a subsequent heating step after the double doping results in the phosphorous outrunning the arsenic and spreading each of the sources and drains downward and to both the left and right, as indicated in FIG. 2.

One object of this second doping is to create an EPROM drain of a high density core of arsenic ions for making good ohmic contact thereto and to form around this core a low density N-type shell of phosphorous ions that extend under the EPROM floating gate 44a' to effect an improved EPROM programming efficiency.

A second object of this second doping is to reduce the drain to body leakage and to reduce the chances of a short between the metal 80 and drain 75 and/or 77 at the silicon surface under the "birds beak" field region between the P+ stops 26 and the only-arsenic doped drains 75 and 77 as seen in FIG. 1. Such an undesirable leakage, or short condition, may be brought about by a slight misregistration between the metal contacts 80 and the EPROM and N-channel devices.

The improvement in programming efficiency is accomplished by the phosphorous drain extension under the floating electrode 44a' and it is therefore only necessary to apply the second phosphorous doping to the drains, and not the sources, of the EPROM device. To dope only the drains will require an additional photoresist masking step for covering the sources and opening the drains.

However, to fully achieve the reduced likelihood of shorting between both the sources and drains of the EPROM and N-channel devices, the secondary doping (with phosphorous) must also be applied to the sources. A further advantage of phosphorous doping to both the sources and drains is that no additional photomask is required. The phosphorous implant is done using the same mask 68 as was used for the arsenic implant.

Referring to FIG. 2, a contact etching step is performed. In this step, glass is deposited on the surface and heated until it reflows slightly, thereby forming reflow glass layer 78. Photoresist is then deposited and contact holes are cut to all source, drain and gate regions. The photoresist is then removed.

A metal alloy is then deposited. This metal alloy comes in contact with the areas beneath the apertures which have been etched in glass layer 78, thereby forming metal contacts 80. This is followed by a metal photoresist masking and a metal etch which leaves metal above the regions to which the contact is required. A passivation layer 82 is then deposited and etched, resulting in the final structure as shown in FIG. 2.

Tests of programming efficiency were conducted on experimental EPROM devices of this invention, and on another group of EPROM devices that had no secondary (phosphorous) doping of the source and drain. Each device was programmed by connecting substrate and source to ground potential and momentarily connecting the drain and control gate to a +15V potential. A 1500 ohm resistor was connected between the drain and the +15V supply. The momentary connection of +15V to the control gate and drain was varied over the range of 0.5 to 10 milliseconds. After programming at each "pulse" width, the read threshold voltage at which the control gate must be raised, to make the EPROM channel conductive, was measured. For devices having a phosphorous ion implantation of zero, of $1 \times 10^{13}$ atoms/cm$^2$ and of $5 \times 10^{13}$ atoms/cm$^2$, both at 120 KEV, the threshold voltages were respectively 3.3 volts, 4.8 volts and 5.9 volts when the programming duration was at 0.5 milliseconds. When the programming pulse duration is 10 milliseconds, the threshold voltages were, respectively, 6.2 volts (with no phosphorous implant), 6.9 volts and 7.7 volts. These very large and beneficial changes in programming efficiencies for only about 0.1 micron lateral extension of the drain under the EPROM floating gate were found quite surprising and are not fully understood.

What is claimed is:

1. A method for making an EPROM integrated circuit comprising
   (a) forming an insulative layer over a silicon substrate, the region of said substrate at which an EPROM device is to be formed having a conductivity of one type;
   (b) forming a floating gate over said isolation layer at a central portion of a region of said substrate at which said EPROM device is to be formed;
   (c) implanting ions of a first kind through said insulating layer into said substrate, at two subregions within said EPROM region that are on opposite sides of and adjacent to said floating gate to form the source and drain of said EPROM device;
   (d) implanting ions of a second kind through said insulating layer into said substrate at said two subregions, wherein said first and second kind are of the opposite conductivity type relative to said EPROM substrate region, and wherein said second kind of ions has a greater coefficient of diffusion in silicon than do ions of said first kind;
   (e) forming a mask over said substrate, said mask having an aperture for exposing a portion of said EPROM device region through which said implantings are selectively effected and self aligned with said floating gate at said two sub-regions; and
   (f) heating said substrate to cause said first kind ions to form a drain-core and a source-core having a high impurity concentration and to cause said ions of said second kind to extend laterally about 0.1 micron under said floating gate from said cores to form a relatively low impurity concentration region beyond said high concentration core, to shorten the channel length to less than the width of said floating gate between said source and drain, and to improve the programing efficiency of said EPROM device.

2. The method of claim 1 additionally comprising forming a second gate spaced from and over said floating gate.

3. The method of claim 1 additionally comprising heavily doping with ions of said one conductivity type a guard ring region at the surface of said substrate encircling said EPROM gate, source and drain, said implanting ions of said second kind extending laterally into an adjacent portion of said guard ring region from said sources and drains to convert said adjacent guard ring portion to the conductivity of said opposite type, so that leakage current across the source-substrate and drain-substrate junction will be reduced and so that the chances of any subsequently deposited metal contacts which may be made to said source and drain will not short to said guard ring region.

* * * * *